United States Patent
Carroll et al.

[11] Patent Number: 6,157,726
[45] Date of Patent: Dec. 5, 2000

[54] CIRCUIT AND METHOD OF PREVENTING AUDIO POP IN AN ELECTRONIC AUDIO DEVICE

[75] Inventors: Brian Carroll, Coopersburg; Steven M. Corso, Philadelphia; David E. Zeidler, Warrington, all of Pa.

[73] Assignee: Motorola, Inc., Schaumburg, Ill.

[21] Appl. No.: 08/986,137

[22] Filed: Dec. 5, 1997

[51] Int. Cl.[7] .................................................. H04B 15/00
[52] U.S. Cl. ........................................... 381/94.5; 381/81
[58] Field of Search ................................ 381/94.1, 94.5, 381/77, 123, 80, 81

[56] References Cited

U.S. PATENT DOCUMENTS 4,675,905   6/1987   Flora ........................................ 381/94.5
4,941,187   7/1990   Slater ....................................... 381/94.5

*Primary Examiner*—Minsun Oh Harvey
*Attorney, Agent, or Firm*—Ronald P. Kananen; Rader, Fishman & Grauer PLLC

[57] ABSTRACT

A circuit connected between an audio signal receiver and an audio output unit can prevent an audio pop from being emitted by a speaker associated with the audio output unit. The circuit interrupts the output of the signal receiver when the DC voltage level of the system suddenly changes, e.g. when a different audio signal is selected or when the receiver is powered on or off. The output of the receiver is shunted through a resistor to ground until a blocking capacitor between the receiver and audio output unit can charge to the new DC voltage level.

15 Claims, 2 Drawing Sheets

CIRCUIT AND METHOD OF PREVENTING AUDIO POP IN AN ELECTRONIC AUDIO DEVICE

FIELD OF THE INVENTION

The present invention relates to the field of audio electronics. More particularly, the present invention relates to the prevention of audio pop in electronic audio equipment when powering the equipment up or down, or when selecting among a plurality of audio signals for output.

BACKGROUND OF THE INVENTION

In modern society, electronic equipment serves a wide variety of purposes. Many examples of such electronic equipment allow an audio signal to be reproduced or received and output to an amplifier or speaker. The audio signal is then transduced so as to be audible to a listener. Examples of electronic audio equipment that reproduce audio signals include compact disc players, video cassette recorders (VCRs), and computers. Examples of electronic audio equipment that receive transmitted audio signals include televisions and radios.

As will be familiar to anyone who has used any of these electronic audio devices, the speaker or speakers of the device often produce an audible pop that is not part of a reproduced or received audio signal. This audio pop may be produced when power is initially supplied to the electronic audio device, when the power to the electronic audio device is turned off or when a device that can receive several different audio signals or channels is switched from one channel to another.

A conventional electronic audio device is illustrated in FIG. 1. FIG. 1 shows an electronic audio device 101 which can provide any one of three input audio signals; Audio 1, Audio 2, and Audio 3, as the output audio signal. A switch 102 connects a line driver 103, e.g. an amplifier, to any one of the three audio signals.

The line driver 103 is powered, for example, by an electric plug 106 which is plugged into an electrical wall outlet. Alternatively, the line driver may be powered by batteries. A switch 104 is provided between the power source 106 and the line driver 103. This switch 104 allows power to be selectively provided to the line driver 103 and is, typically, the ON/OFF switch for the electronic audio device 101.

When the line driver 103 is powered, the audio signal selected by the switch 102 is provided, through a capacitor 105, to an audio output unit 108. The audio output unit may be, for example, an amplifier and speaker incorporated into a television, a stereo, a recording system, a radio, a computer or any other electronic audio equipment.

Associated with each audio signal is a DC voltage level to which the capacitor 105 becomes charged. When this DC voltage level is changed significantly and abruptly, for example, by switching to another audio signal having a different DC voltage level, the change in the voltage level of the system is propagated through the system to the audio output unit 108. This sudden change in voltage level, when it arrives at the audio output unit 108, causes any speaker associated with the audio output unit 108 to emit an audio pop.

In addition to switching between audio signals, the DC voltage level of the system is also abruptly changed when the switch 104 is turned on or off. Thus when the electronic audio device 101 is switched on or off with the switch 104, the change in the DC level of the system may cause the audio output unit 108 to pop.

Audio pop is unpleasant to the listener and, over time, may cause damage or wear to the audio output unit 108. Accordingly, there is a need in the art for a method and circuit for preventing audio pop in electronic audio equipment.

SUMMARY OF THE INVENTION

It is an object of the present invention to meet the above-described needs and others. Specifically, it is an object of the present invention to provide a method and circuit for preventing audio pop in an electronic audio device.

Additional objects, advantages and novel features of the invention will be set forth in the description which follows or may be learned by those skilled in the art through reading these materials or practicing the invention. The objects and advantages of the invention may be achieved through the means recited in the attached claims.

To achieve the stated and other objects of the present invention, as described below, the invention may be embodied in a circuit for preventing audio pop in electronic audio equipment which includes an audio signal receiver for receiving at least one audio signal and for providing an output audio signal to an audio output device; and a first switch for temporarily shunting the output audio signal away from the audio output unit when power is initially supplied to the receiver or power to the receiver is interrupted. The first switch preferably shunts the output audio signal through a resistor to ground.

The receiver may receive more than one audio signal. In this case, the circuit of the invention may include a selection switch for selecting one of the audio signals as the output audio signal. The first switch temporarily shunts the output audio signal away from the audio output unit when the selection switch is actuated to select one of the input audio signals.

The circuit also includes a capacitor between the receiver and the audio output unit. The first switch shunts the output audio signal away from the audio output unit until the capacitor charges to a DC voltage level applied to the capacitor.

A circuit embodying the present invention may also include a second switch, which is normally closed, between the receiver and the audio output unit. This second switch is opened which the first switch is closed to assist in shunting the output audio signal away from the audio output unit.

The present invention also encompasses a method of preventing an audio pop in electronic audio equipment by selectively breaking a connection between an audio signal receiver and an audio output unit to shunt an output audio signal, output by the audio signal receiver, away from the audio output unit.

According to this method, the output audio signal is shunted away from the speaker while a capacitor connected between the receiver and the audio output unit charges to a DC voltage level applied to the capacitor. The shunting may be performed in response to power being supplied to the receiver or in response to a power supply to the receiver being interrupted. If the receiver selects an output audio signal from among several input audio signals, the shunting may be performed when the receiver selects an output audio signal. Preferably the shunting is accomplished by shunting the output audio signal through a resistor to ground.

BRIEF DESCRIPTION OF THE DRAWINGS

The accompanying drawings illustrate the present invention and are a part of the specification. Together with the following description, the drawings demonstrate and explain the principles of the present invention.

DETAILED DESCRIPTION OF THE PREFERRED EMBODIMENTS

Using the drawings, the preferred embodiments of the present invention will now be explained.

Figure 1:
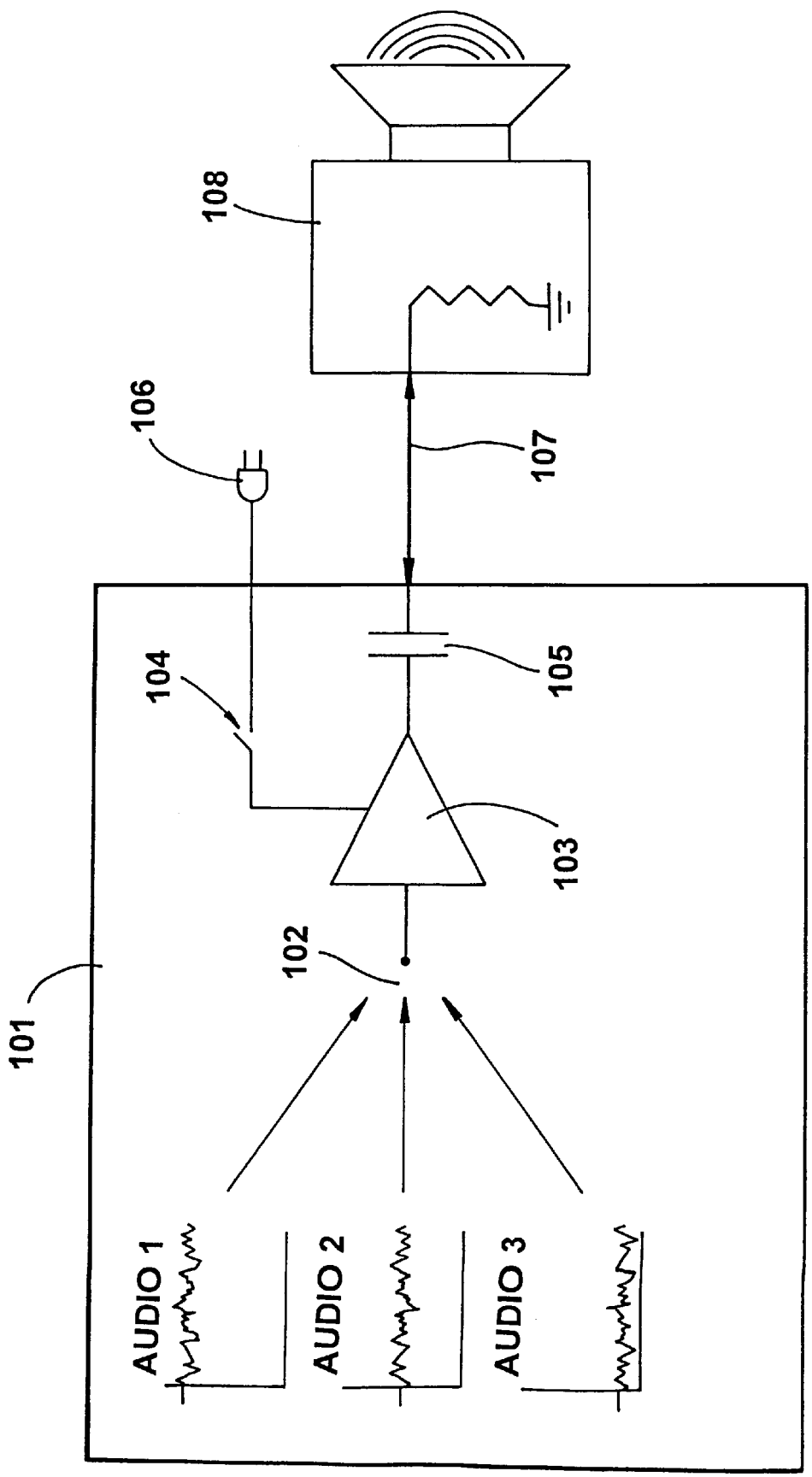
FIG. 1 is an illustration of a conventional electronic audio device.
Figure 2:
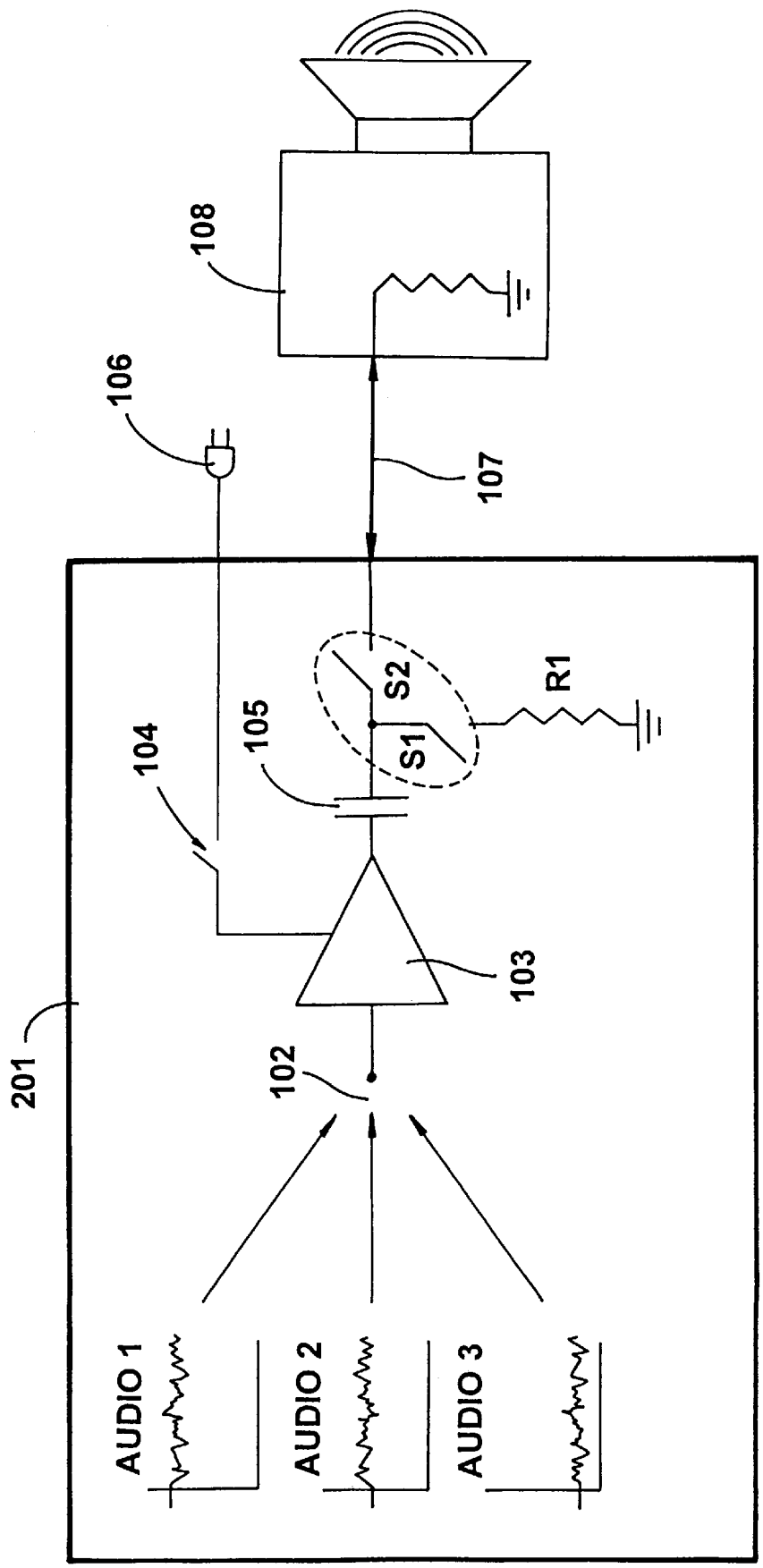
FIG. 2 is an illustration of an electronic audio device according to the present invention.

FIG. 2 illustrates an exemplary circuit embodying the present invention. Similar to the system in FIG. 1, the embodiment of the present invention shown in FIG. 2 includes an electronic audio device 201 which can receive any of several audio signals, Audio 1, Audio 2 or Audio 3. A selection switch 102 is provided for selecting one of these input audio signals to be an output audio signal which is provided to the line driver 103.

As before, the line driver 103 is powered by an external power source 106, preferably a connection to a electrical wall outlet. A power switch 104 is connected between the line driver 103 and the power source 106 to function as an ON/OFF switch for the electronic audio device 201.

The electronic audio device is connected, through a connection 107, to an audio output unit 108. The audio output unit 108 may be a speaker, an amplifier or an amplifier connected to and driving a speaker. If the audio output unit 108 includes or is connected to a speaker, that speaker can transduce the selected audio signal into audible sound waves to be heard by a listener.

Between the line driver 103 and the audio output unit 108, an audio pop prevention circuit is connected. A capacitor 105 is connected to the output of the line driver 103. The other terminal of the capacitor 105 is connected to a switch S2 which opens or closes a signal path between the capacitor 105 and the connection 107 to the audio output unit 108. Through another switch S1, a resistor R1 is connected between ground and a point between the capacitor 105 and switch S2.

During normal operation, i.e. the uninterrupted reception of a particular audio signal that is transmitted through the line driver 103 and capacitor 105 to the audio output unit 108, switch S2 is closed and switch S1 is open. However, if selection switch 102 or power switch 104 is actuated, a possible audio pop may result. Accordingly, after the selection switch 102 or the power switch 104 is actuated by a user, but before the switch is actually switched, switch S2 is opened and switch S1 is closed.

If the selection switch 102 was actuated, the selected audio signal is then switched and a new audio signal is selected. Alternatively, if the power switch 104 was actuated, the line driver 103 is powered or power is interrupted depending on whether switch 104 was opened or closed. In either of these cases, a new DC voltage level will be provided to the capacitor 105.

While the capacitor 105 charges to the new DC voltage level, switch S2 remains open and switch S1 remains closed. The introduction of R1 to the circuit allows the capacitor to charge to the new DC voltage level more quickly. Otherwise the charge time and the audio frequency response would be conflicting. The signal spike that would have produced the audio pop is absorbed by the resistor R1 rather than the audio output unit 108.

When the capacitor 105 is charged to the new DC voltage level, switch S2 is closed and switch S1 is opened to return the system to the normal operating mode. The various methods and structures for constituting the switches S1 and S2, and for controlling the switches in response to the charged state of the capacitor 105 will be readily apparent to those skilled in the art based on the principles of the present invention disclosed herein and are, therefore, not described in detail here.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A circuit for preventing an audio pop in electronic audio equipment comprising:

an audio signal receiver for receiving at least one audio signal and providing an output audio signal to an audio output unit, wherein said receiver receives a plurality of audio signals and comprises a selection switch for selecting one of said audio signals as said output audio signal;

a first switch for temporarily shunting said output audio signal away from said audio output unit when power is initially supplied to said receiver or power to said receiver is interrupted, wherein said first switch temporarily shunts said output audio signal away from said audio output unit when said selection switch is activated to select one of said audio signals; and a second switch, which is normally closed, between said receiver and said audio output unit, said second switch being opened which said first switch is close to shunt said output audio signal away from said audio output unit.

2. A circuit as claimed in claim 1 wherein, when closed, said first switch shunts said output audio signal through a resistor to ground.

3. A circuit as claimed in claim 1, further comprising a capacitor between said receiver and said audio output unit, wherein said first switch shunts said output audio signal away from said audio output unit until said capacitor charges to a DC voltage level applied thereto.

4. A circuit as claimed in claim 1, further comprising a capacitor between said receiver and said audio output unit, wherein said first switch shunts said output audio signal away from said audio output unit and said second switch is open until said capacitor charges to a DC voltage level applied thereto.

5. A circuit for preventing an audio pop in electronic audio equipment comprising:

an audio signal receiver for receiving at least one audio signal and providing an output audio signal to an audio output unit, wherein said receiver receives a plurality of audio signals and comprises a selection switch for selecting one of said audio signals as said output audio signal;

a first switch for temporarily shunting said output audio signal away from said audio output unit when power is initially supplied to said receiver or power to said receiver is interrupted, wherein said first switch temporarily shunts said output audio signal away from said audio output unit when said selection switch is activated to select one of said audio signals, wherein, when closed, said first switch shunts said output audio signal through a resistor to ground.

6. A circuit as claimed in claim 5, further comprising a capacitor between said receiver and said audio output unit, wherein said first switch shunts said output audio signal away from said audio output unit until said capacitor charges to a DC voltage level applied thereto.

7. A method of preventing an audio pop in electronic audio equipment comprising selectively breaking a connection between an audio signal receiver and an audio output unit to shunt an output audio signal, output by said audio signal receiver, away from said audio audit unit in response to occurrence of a condition which would cause said audio pop in said electronic audio equipment, wherein said shunting comprises shunting said output audio signal away from said audio output unit while a capacitor connected between said receiver and said audio output unit charges to a DC voltage level applied thereto.

8. A method of as claimed in claim 7, wherein said shunting is performed in response to power being supplied to said receiver or in response to a power supply to said receiver being interrupted.

9. A method of as claimed in claim 7, wherein said shunting is performed when said receiver, which selects said output audio signal from a plurality of input audio signals, selects an output audio signal.

10. A method of as claimed in claim 7, wherein said shunting further comprises shunting said output audio signal through a resistor to ground.

11. A method of as claimed in claim 7, further comprising selecting said output audio signal with said receiver from among a plurality of input audio signals received by said receiver wherein said shunting is performed when said selecting is performed.

12. A circuit for preventing an audio pop in electronic audio equipment comprising:

an audio signal receiver for receiving an audio signal, said audio signal receiver further comprising a signal path for transmitting said audio signal to an audio output unit, said receiver receives a plurality of audio signals and comprises a selection switch for selecting one of said audio signals as said output audio signal;

a first switch in said signal path for temporarily breaking said signal path to shunt said output audio signal away from said audio output unit so as to prevent said audio signal from reaching said audio output unit, wherein said first switch shunts said audio signal when power is initially supplied to said receiver, power to said receiver is interrupted, or a source of said audio signal is switched, and wherein said first switch temporarily shunts said audio signal away from said audio output unit when said selection switch is activated to select one of said audio signals; and a second switch, which is normally closed, between said receiver and said audio output unit, said second switch being opened which said first switch is close to shunt said output audio signal away from said audio output unit.

13. A circuit as claimed in claim 12 wherein, when closed, said first switch shunts said audio signal through a resistor to ground.

14. A circuit as claimed in claim 12, further comprising a capacitor between said receiver and said audio output unit, wherein said first switch shunts said audio signal away from said audio output unit until said capacitor charges to a DC voltage level applied thereto.

15. A circuit as claimed in claim 12, further comprising a capacitor between said receiver and said audio output unit, wherein said first switch shunts said audio signal away from said audio output unit and said second switch is open until said capacitor charges to a DC voltage level applied thereto.

* * * * *